United States Patent [19]

Umemoto et al.

[11] Patent Number: 6,075,389

[45] Date of Patent: Jun. 13, 2000

[54] OPERATION SPEED MEASURING CIRCUIT AND SEMICONDUCTOR DEVICE INCORPORATING THE SAME CIRCUIT

[75] Inventors: Yasunobu Umemoto; Toshikazu Sei, both of Kawasaki; Katsuro Doke; Eiji Ban, both of Yokohama, all of Japan

[73] Assignee: Kabushiki Kaisha Toshiba, Kawasaki, Japan

[21] Appl. No.: 08/522,955

[22] Filed: Sep. 1, 1995

[30] Foreign Application Priority Data

Sep. 2, 1994 [JP] Japan .................................. 6-210175

[51] Int. Cl.[7] ...................................................... H03D 3/00
[52] U.S. Cl. ................................................. 327/49; 327/99
[58] Field of Search .................................. 327/36, 38, 43, 327/44, 47, 49, 99, 166, 176, 261, 263, 564, 565, 277; 326/104

[56] References Cited

U.S. PATENT DOCUMENTS

| | | | |
|---|---|---|---|
| 4,583,008 | 4/1986 | Grugett | 327/263 |
| 4,675,546 | 6/1987 | Shaw | 327/176 |
| 5,013,944 | 5/1991 | Fischer et al. | 327/277 |
| 5,306,959 | 4/1994 | Knauft et al. | 327/176 |
| 5,365,181 | 11/1994 | Mair | 377/47 |
| 5,384,816 | 1/1995 | Prysby et al. | 377/48 |
| 5,420,531 | 5/1995 | Wetlaufer | 327/276 |
| 5,428,309 | 6/1995 | Yamauchi et al. | 327/277 |
| 5,438,550 | 8/1995 | Kim | 327/175 |
| 5,440,592 | 8/1995 | Ellis et al. | 327/49 |
| 5,530,387 | 6/1996 | Kim | 377/47 |

FOREIGN PATENT DOCUMENTS 5-8950   2/1993   Japan .
5-95032  4/1993   Japan .

*Primary Examiner*—My-Trang Nu Ton
*Attorney, Agent, or Firm*—Foley & Lardner

[57] ABSTRACT

An operation speed measuring circuit measures a difference in propagation delay time between first and second path 2, 3 including logic gates connected in series and thus confirms that an element provided on a chip obtains a specified operation speed. This operation speed measuring circuit is so constructed as to be controllable by an input signal IN from one input terminal 1 and can be therefore disposed in such an area that the number of placeable terminals is restricted down to a small number. When this operation speed measuring circuit is provided with a power supply terminal independent of other circuits, constructions of other circuits can be independently designed. When the operation speed measuring circuit is disposed in the area independent of an intra-chip integrated circuit design area, a degree of freedom of designing other circuits is improved. This independent area is set in one of corner areas on the semiconductor chip that have hitherto been nothing but empty areas, the degree of freedom of designing the circuit is further improved.

5 Claims, 4 Drawing Sheets

OPERATION SPEED MEASURING CIRCUIT AND SEMICONDUCTOR DEVICE INCORPORATING THE SAME CIRCUIT

BACKGROUND OF THE INVENTION

The present invention relates an operation speed measuring circuit and a semiconductor device incorporating this circuit and, more particularly, to an operation speed measuring circuit suited to measure an operation speed in order to assure an operation of a semiconductor integrated circuit.

Existing and prospective semiconductor makers are required to develop and offer an IC having functions or circuits responding to demands of individual users for short period of time.

In the case of responding to such requests, the makers inevitably need a small quantity of but multiple kinds of productions, and this in turn requires a manufacturing system capable of facilitating a design and providing a flexible respondency. Aiming at this, the preparation for an environment of DA (Design Automation) is being advanced such as preparing the cell library.

At present, with an advancement and the spread of the designing system, the user is able to independently design the IC, and consequently there is an increasing tendency of decentralization into a designer and a manufacturer. If the user designs the IC and orders the maker to manufacture it, the user transfers date about the design to the maker. The maker completes the design on the basis of the data, prepares a mask and manufactures the IC.

There is an IC known as ASIC (Application-Specific IC) among the ICs each constructed by integrating functions necessary for a specific application required by the user.

Given that typical ABICS are a gate array in which elements are regularly arranged independently of a kind-of-chip design with the LSI and a standard cell for forming an LSI chip by hierarchically stacking standardized cell groups registered beforehand and by performing laying out the cell groups and wirings.

A semicustom IC is an IC in which the function needed by a specific user is realized by use of a short-term development type designing element such as the gate array, the standard cell, etc.

The semicustom IC completed with an order received from the user has to be tested for measuring a given performance before being delivered.

A clock frequency of the IC that is dominant at present is a very high as 60–100 MHz, and hence an existing tester is incapable of effecting an operating simulation of the IC.

Under such circumstances, there is used a method of assuring a performance of the IC as a whole by incorporating an operation speed measuring circuit into the IC, measuring an operation speed of the element in this circuit and confirming that a specified operation speed is obtained.

The following is an explanation of how the operation speed measuring circuit is incorporated into the chip.

FIG. 7 is a plan view illustrating an example where the semicustom IC of the conventional operation speed measuring circuit is incorporated into the IC chip. As known from FIG. 7, in the conventional semicustom IC, spaces 70a in the vicinities of four corners of a chip 70 are nothing but empty areas because of being incapable of arranging the wires with respect to an integrated circuit design area 75 at the central portion even when placing an element such as an I/O cell, etc.

Accordingly, an operation speed measuring circuit 71 is so constructed as to be incorporated in a side-by-side relationship within the same area 75 as a specific-application circuit designed by the user. An input cell 72, an output cell 73 and a control cell 74 are connected to the operation speed measuring circuit 71, thereby performing control and input/output operations from outside of the chip.

There arises, however, a problem inherent in the conventional semicustom IC, wherein both the number of gates required and the number of signal pins required increases, and this brings about a rise in the size of the chip because of such a construction that the operation speed measuring circuit is incorporated in the side-by-side relationship within the same area as the specific-application circuit designed by the user as explained above.

Whereas if the size of the chip is fixed, the numbers of the gates and of signal pins that are required for incorporating the operation speed measuring circuit have to be secured previously, and, therefore, a degree of freedom on the occasion of the user's designing the specific-application circuit is remakably restricted.

SUMMARY OF THE INVENTION

It is a primary object of the present invention, which was devised in view of the problems given above, to provide an operation speed measuring circuit constructed with a less number of necessary terminals for connections to the outside than in the prior art, i.e., so constructed as to be controllable by inputting a signal from one input terminal. The present invention also aims at providing a semicustom IC with a construction in which the operation speed measuring circuit is disposed in an area independent of an intra-chip integrated circuit design area.

According to the present invention, the operation speed measuring circuit confirms that an element provided on the chip obtains a specified operation speed by measuring a difference in propagation delay time between a first path and a second path that include logic gates connected in series. The operation speed measuring circuit is so constructed as to be controllable by the input signal from one input terminal and is therefore applicable to a case where the number of placeable terminals is restricted down to a small number.

The operation speed measuring circuit according to the present invention is provided on a semiconductor chip, and hence at least two pieces of signal terminals to be secured for the operation speed measuring circuit may suffice.

The operation speed measuring circuit disposed on the semiconductor chip is provided with a power supply terminal independent of other circuits, and, therefore, construction of the operation speed measuring circuit and of other circuits can be set independently of each other.

The operation speed measuring circuit is disposed in an area independent of other integrated circuit design area within the chip, and it is therefore possible to highly improve the degree of freedom of designing other circuits in the areas exclusive of the relevant independent area.

The operation speed measuring circuit is disposed in one of corner areas on the chip that have hitherto been nothing but empty areas because of being incapable of arranging wires with respect to the integrated circuit design area on the semiconductor chip. Hence, there is no necessity for securing the area for laying out the operation speed measuring circuit in the integrated circuit design area. Then, a degree of freedom of designing the circuit is remarkably improved, and there is eliminated an influence on a degree of integration due to the operation speed measuring circuit.

BRIEF DESCRIPTION OF THE DRAWINGS

Other objects and advantages of the present invention will become apparent during the following discussion in conjunction with the accompanying drawings, in which.

DESCRIPTION OF THE PREFERRED EMBODIMENTS

An operation speed measuring circuit and a semiconductor device incorporating this circuit according to the present invention will hereinafter be described with reference to the drawings.

Figure 1:
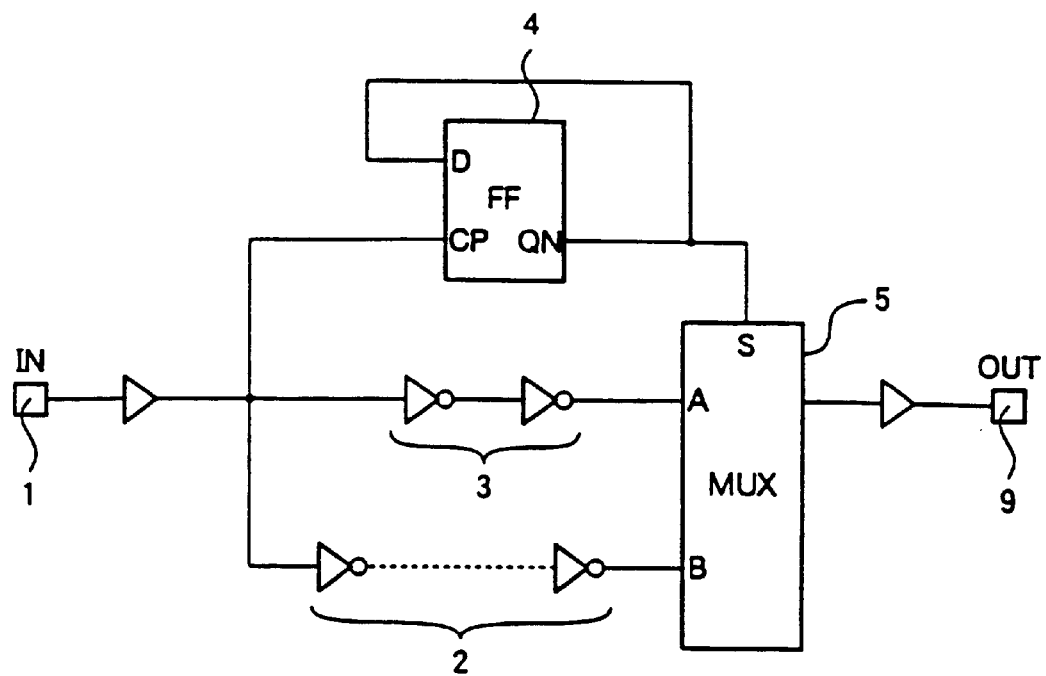
FIG. 1 is a block diagram showing one embodiment of an operation speed measuring circuit according to the present invention.

FIG. 1 is a block diagram illustrating a first embodiment of the operation speed measuring circuit according to the present invention.

Connected to an input terminal 1 are one terminal of a first path 2 for generating a predetermined propagation delay time T1 in an input signal and one terminal of a second path 3 for generating a propagation delay time T2 much smaller than the propagation delay time T1 of the first path 2. Each of these two paths is composed of the same kind of but a plurality of logic gates connected in series, wherein the number of the gates of the first path 2 is larger than the number of the gates of the second path 3.

The other terminals of the first and second paths 2, 3 are connected to input terminals B, A of a multiplexer 5. The first and second paths 2, 3 involve the use of logic gates such as a buffer, an inverter, etc. The inverters are employed as the logic gates of the first and second paths 2, 3 shown in FIG. 1.

A selection as to whether a first signal propagated via the first path 2 or a second signal propagated via the second path 3 is to be outputted is made by inputting an output signal, serving as a selector signal, of a frequency divider 4 for dividing a frequency of the input signal to an input terminal of a multiplexer 5, and the selected signal is outputted from an output terminal 9.

Figure 2:
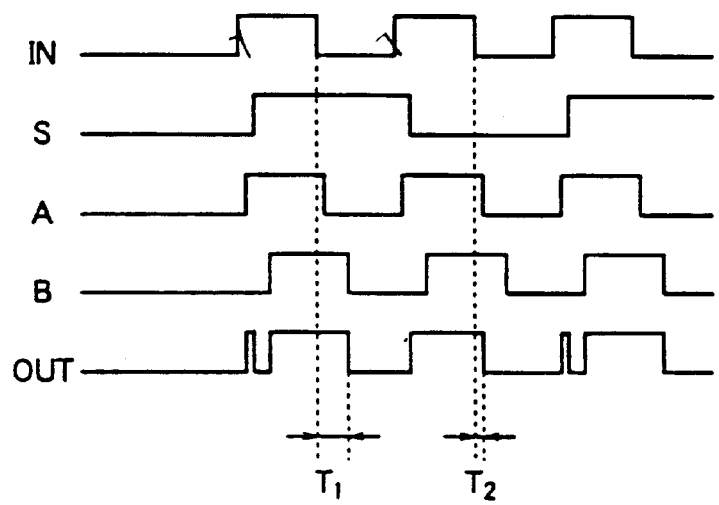
FIG. 2 is a timing chart of signals are respective points within the operation speed measuring circuit shown in FIG. 1.

FIG. 2 is a timing chart of the signal at every point within the operation speed measuring circuit FIG. of 1 but illustrates waveforms of an input signal IN at the input terminal 1, a selector signal 3, a first signal B and a second signal A respectively at input terminals S, B, a of a multiplexer 5 and a signal OUT at an output terminal 9 of the operation speed measuring circuit.

The input signals IN inputted from the input terminal 1 are propagated respectively to the first path 2 and the second path 3 and then inputted to the terminals B, A of the multiplexer 5 in the form of the first signal B and the second signal A with the propagation delay times T1, T2 generated. Further, the input signal IN is also an input signal to the frequency divider 4. In this case, the frequency divider 4 outputs the selector signal 3 having a frequency that is ½ of the frequency of the input signal IN and inputs it to the terminal 3 of the multiplexer 5. Thus, the selector signal S takes an inverted value of the value of the last time only when the input signal IN rises, and it follows that no change can be seen even when the input signal IN falls.

The selector signal S of the multiplexer 5 serves as an output signal of the frequency divider 4 and is therefore unstable in terms of it initial state. If it is herein, however, assumed that the selector signal S is at an "L" level, the second signal A is outputted as an output signal OUT to the output terminal 9. In this state, when the input signal IN to the input terminal 1 assumes "H" level, the second signal A with a relatively short propagation delay time of the second path 3 assumes the "H" level, and "H" is outputted also to the output signal OUT of the output terminal 9. The selector signal S serving as an output signal of the frequency divider 4, however, assumes "H" after a delay time intrinsic to the frequency divider 4 has elapsed, and the first signal B with a relatively long delay time of the first path 2 is outputted to the output terminal 9. At this time, the first signal B on the first path 2 is till at "L", but "H" is outputted after the propagation delay time of the first path has elapsed since the input signal IN rose. The propagation delay time T1 of the first path is a time T1 till the output signal OUT falls since the input signal IN fell thereafter.

Next, when the input signal IN rises, the selector signal S assumes "L", and the second signal A of the second path 3 is outputted to the output terminal 9. At this time, the second signal A is at "H". In this case also, the propagation delay time T2 of the second path 3 is a time T2 till the output signal OUT falls since the input signal IN fell.

A delay time per stage of a gate is obtained by the following formula:

Delay Time Per Stage of GATE=ABS (T1−T2)/(m−n)

where m is the number of stages of logic gates of the first path 2, n is the number of stages of the logic gates of the second path 3, a value within brackets in [ABS( )] is an absolute value, and m>n.

A relationship in magnitude between the propagation delay times T1, T2 is given by T1>T2. However, the difference takes an absolute value because of the output being replaced depending on the initial state of the frequency divider.

As explained above, the delay time per stage of the gate is calculated, or alternatively the operation speed is further calculated, thereby making it possible to assure the operation speed of the IC as a whole by confirming that the logic gate within the operation speed measuring circuit obtains a specified operation speed.

Based on the construction of this operation speed measuring circuit, the circuit can be controlled and operated by use of only one input terminal and one output terminal, and it is therefore possible to lay out the relevant operation speed measuring circuit even if the number of placeable terminals is restricted down to a small number.

Figure 3:
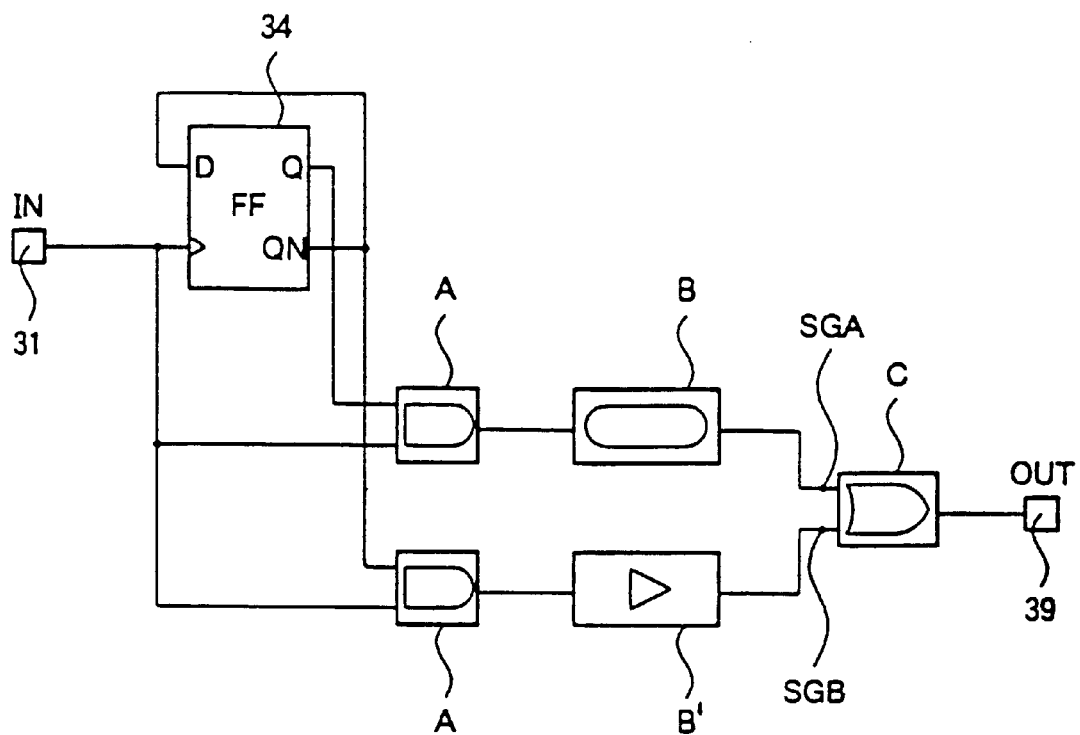
FIG. 3A is a block diagram illustrating a second embodiment of the operation speed measuring circuit of the present invention.
FIG. 3B illustrates alternative logic which may be employed in equivalents of the circuit illustrated in FIG. 3A.

FIG. 3A is a block diagram illustrating a second embodiment of the operation speed measuring circuit according to the present invention.

As in the first embodiment, in accordance with a second embodiment, there are provided a first path B, composed of the same kind of but a plurality of logic gates connected in series, for generating the predetermined propagation delay time T1 in an input signal and a second path B', composed of the same kind of but an integer number of logic gates as that of the first path B which are connected in series, for generating the propagation delay time T2 much smaller than the propagation delay time T1 of the first path 3. The first and second paths B, B' involve the use of the logic gates such as a buffer, an inverter, etc.

The first and second paths B, B' are provided with selection gates A, composed of the same kind of logic gates, for selecting whether the input signal IN inputted from an input terminal 31 is inputted or not.

Inputted to each of these selection gates A are the input signal IN and an output signal of a frequency divider 34 for dividing a frequency of the input signal IN. The output signal of the frequency divider 34 is classified into a first selector signal Q having a frequency that is ½ of the input signal IN and a second selector signal QN into which the first selector signal Q is inverted. The first selector signal Q is inputted to the selection gate A of the first path B, while the second selector signal QN is inputted to the selection gate A of the second path B'.

Further, one or both of a first signal SGA propagated via the first path B and a second signal SGB propagated via the second path B' are selected and synthesized, and a selection gate C defined as a logic gate for outputting it from an output terminal 39 is connected thereto.

Figure 4:
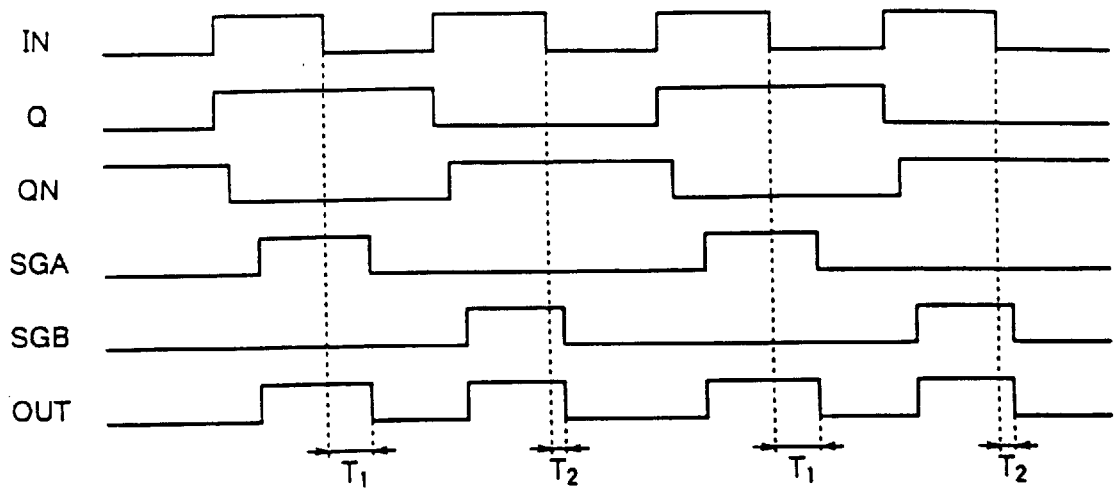
FIG. 4 is a timing chart of the signals at the respective points within the operation speed measuring circuit in a case where an AND gate is disposed as a selection gate A, an OR gate is disposed as a selection gate C, and buffers are disposed as logic gates of first and second paths B, B' in the operation speed measuring circuit shown in FIG. 3.

FIG. 4 is a timing chart of the signal at the respective points within the operation speed measuring circuit in a case where an AND gate is disposed as the selection gate A, an OR gate is disposed as the selection gate C, and the buffers are employed as the logic gates of the first and second paths B, B'. This timing chart illustrates waveforms of the input signal IN at the input terminal, the first end second selector signals Q, QN defined as two output signals of the frequency divider 34, the first and second signals SGA, SGB and the output signal OUT from the output terminal 39 of the operation speed measuring circuit.

The input signals IN inputted from the input terminal are inputted respectively to the frequency divider 34, the selection gate A of the first path B and the selection gate A of the second path B'. Outputted, on the other hand, from the frequency divider 34 are the first selector signal Q having the frequency that is ½ of the input signal IN and the second selector signal QN into which the first selector signal Q is inverted. The first and second selector signals Q, QN are inputted respectively to the selection gate A of the first path B and the selection gate A of the second path B'. Accordingly, even when the input signal IN assumes "H", the output signals from the selection gates A of the first and second paths B, B' do not simultaneously assume the "H" level at all. Further, the first and second selector signals Q, QN take inverted values of the values of the last time only when the input signal IN rises, but it follows that no change can be seen even when the input signal IN falls.

When the input signal IN rises and assumes the "H" level, the first selector signal Q is at "H". The input signal IN inputted to the selection gate A of the first path B is outputted as it remains at "H" and propagated via the first path B, resulting in a generation of a relatively long propagation delay time. The first signal SGA takes a waveform of the signal propagated via the first path B and assumes "H" after the relatively long propagation delay time of the first path B has elapsed. At this time, the second selector signal QN is at "L". Therefore, the output signal of the selection gate A of the second path B' is at "L", and the second signal SGB propagated via the second path B' is also at "L". The selection gate C is composed of the OR gate and hence outputs "H", if at least one of the first and second signals SGA, SGB is at "H".

The propagation delay time T1 of the first path B is a time T1 till the output signal OUT falls since the input signal IN fell thereafter.

Next, when the input signal IN rises and assumes "H", the first selector signal Q is inverted to "L", and the output signal of the selection gate A of the first path B becomes "L", and the first signal SGA also becomes "L". At this time, the second selector signal QN is at "H", and, therefore, the input signal IN inputted to the selection gate A of the second path B' is outputted as it remains at "H" and propagated via the second path B', resulting in a generation of a relatively short propagation delay time. The second signal SGB takes a waveform of the signal propagated via the second path B' and assumes "H" after the relatively short propagation delay time of the second path B' has elapsed. The selection gate C outputs [H] of the second signal SGB as it is.

The propagation delay time T2 of the second path B' is a time T2 till the output signal OUT falls since the input signal IN fell thereafter.

A delay time per stage of the gate is, as in the same way with the first embodiment, calculated from the propagation delay time T2 of the second path B' as well as from the propagation delay time T1 of the first path B. Alternatively, the operation speed is further calculated, and it is confirmed that the logic gate within the operation speed measuring circuit obtains a specified operation speed, thereby making it possible to assure the operation speed of the IC as a whole.

Based on the construction of this operation speed measuring circuit also, the circuit can be controlled and operated by use of only one input terminal and one output terminal, and it is therefore possible to lay out the relevant operation speed measuring circuit even if the number of placeable terminals is restricted down to a small number.

Note that the AND gate is adopted as the selection gate, the buffers are adopted as the first and second path B, B', and the OR gates is adopted as the selection gate C in the above discussion on the second embodiment, but the following combinations as illustrated in FIG. 3B may be employed.

(1) The AND gate is used for the selection gate A, the buffers are employed for the first and second paths B, B', and a NOR gate is used as the selection gate C.

(2) The AND gate is used as the selection gate A, the inverters are used as the first and second paths B, B', and the AND or NAND gate is employed as the selection gate C.

(3) The NAND gate is employed as the selection gate A, the buffers are used as the first and second paths B, B', and the OR or NOR gate is employed as the selection gate C.

(4) The NAND gate is used as the selection gate A, the inverters are employed as the first and second paths B, B', and the AND or NAND gate is used as the selection gate C.

(5) The OR gate is adopted as the selection gate A, the buffers are adopted as the first and second paths B, B', and the OR or NOR gate is adopted as the selection gate C.

(6) The OR gate is adopted as the selection gate A, the inverters are adopted as the first and second paths B, B', and the AND or NAND gate is adopted as the selection gate C.

(7) The NOR gate is adopted as the selection gate A, the buffers are adopted as the first and second paths B, B', and the OR or NOR gate is adopted as the selection gate C.

(8) The NOR gate is used as the selection gate A, the inverters are employed as the first and second paths B, B', and the AND or NAND gate is used as the selection gate C.

Even though the waveforms of the output signals are different, it is possible to obtain the propagation delay time T1 of the first path B and the propagation delay time T2 of the second path B' from the output signal waveform as well as from the input signal waveform in any case.

Figure 5:
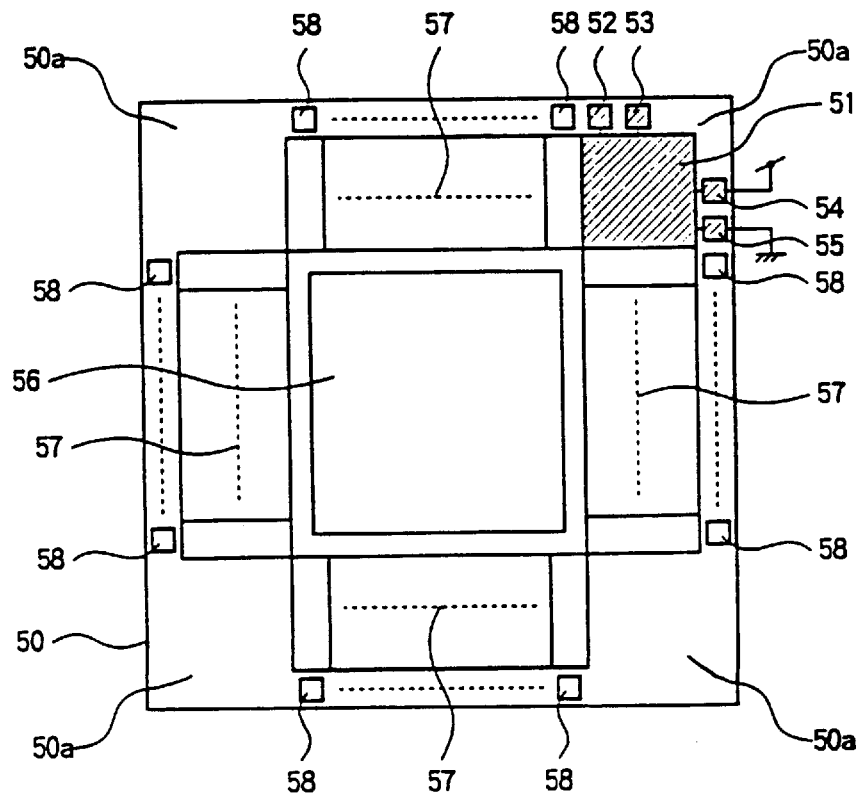
FIG. 5 is a plan view showing one embodiment of a semiconductor chip incorporates the operation speed measuring circuit of the present invention.

FIG. 5 is a plan view illustrating one embodiment of a semiconductor chip incorporating the operation speed measuring circuit according to the present invention. Further, FIG. 6 is a block diagram showing one embodiment in which the operation speed measuring circuit of the present invention is provided with a power supply terminal independent of other circuits and can be thus disposed independently of other circuits on the chip in terms of circuit construction.

As known from FIG. 5, no wire could be hitherto arranged in a space with respect to an integrated circuit design area 56 at the central portion, and hence the operation speed measuring circuit is disposed in one of spaces 50a occupying in the vicinities of four corners of a chip 50, which are empty areas without providing elements such as I/O cells, etc. This is, as explained above, controllable if the operation speed measuring circuit secures one input terminal and one output terminal and can be actualized by providing the power supply terminal independent of other circuits as shown in FIG. 6. Note that the four spaces 50a are provided in the vicinities of the corners of the chip 50, and hence four pieces of operation speed measuring circuits using different kinds of logic gates can be provided at the maximum.

Figure 6:
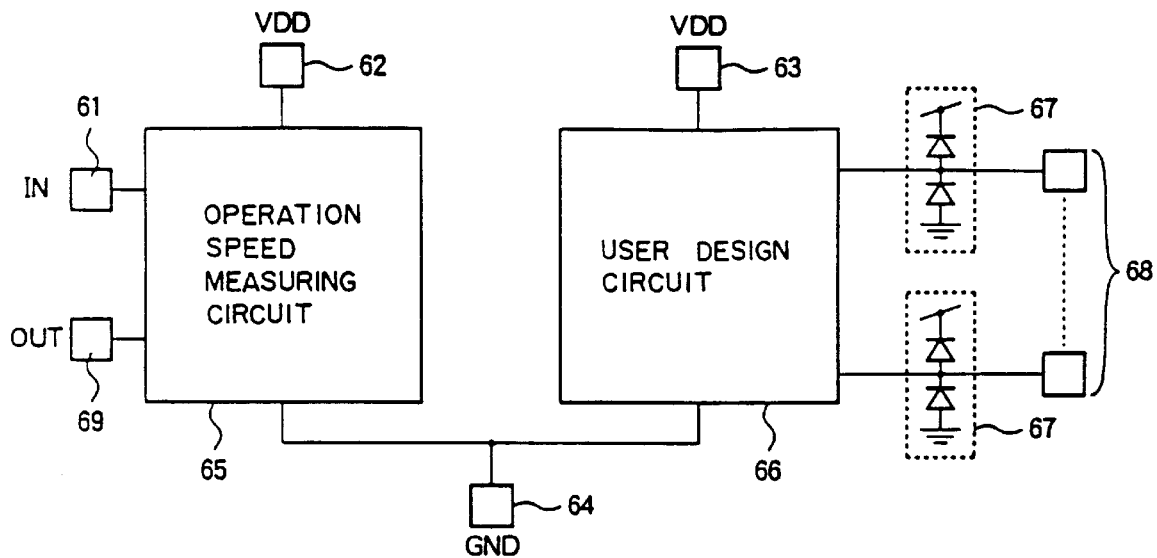
FIG. 6 is a block diagram showing one embodiment in which the operation speed measuring circuit of the present invention is provided with a power supply terminal independent of the other circuits.
Figure 7:
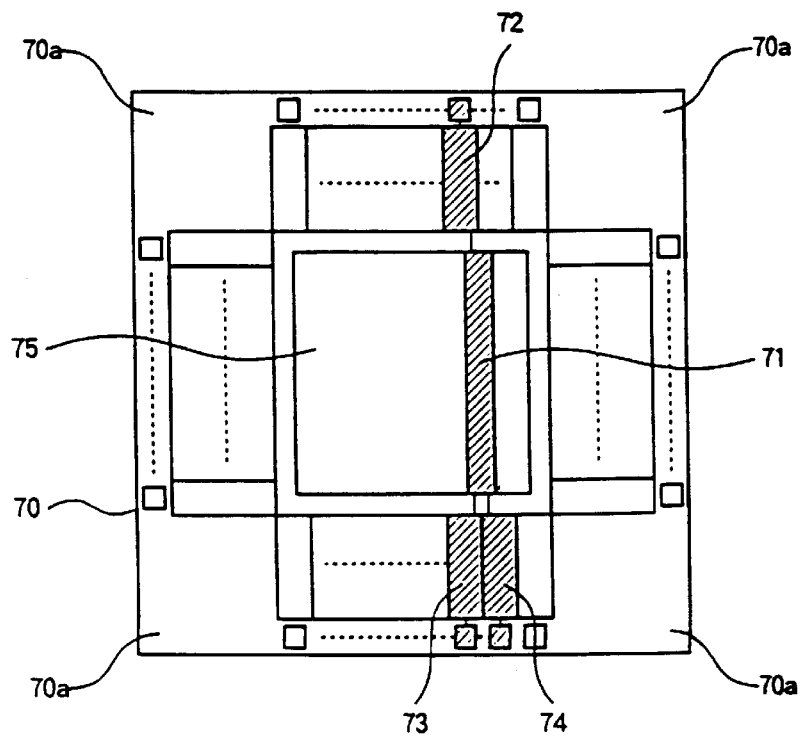
FIG. 7 is a plan view showing an example where a semicustom IC chip incorporates a conventional operation speed measuring circuit.

According to the circuit construction of FIG. 6, an operation speed measuring circuit 65 is provided with a power supply terminal 62, while a user design circuit 66 is provided with a power supply terminal 63. A ground terminal 64 can be employed in common to the operation speed measuring circuit 65 and the user design circuit 66.

The operation speed measuring circuit 65 is controlled by input and output terminals 61, 69, while the user design circuit 66 is controlled by a plurality of terminals 68.

In the circuit of FIG. 6, for effectively making use of the limited space, ESD protection circuits 67 each having a large occupying area are provided for only the user design circuit 66 but not provided for the operation speed measuring circuit 65. The operation speed measuring circuit 65 is a circuit unused after performing a measurement once, and, therefore, though there is absolutely no trouble even if ESD-destructed after the measurement, a feed through current flows depending on a form of the destruction. This may cause an increment in a futile consumption of the electric power is some cases. According to the circuit construction of FIG. 6, the power supply terminal 62 is independently provided for the operation speed measuring circuit 65, while the power supply terminal 63 is also independently provided for the user design circuit 66. Therefore, after using the operation speed measuring circuit 65, the supply of the electric power to the power supply terminal 62 is cut OFF, thereby avoiding the problem given above.

As discussed above, the operation speed measuring circuit according to the present invention is controllable by inputting the signals from one input terminal and therefore applicable even when the number of placeable terminal is restricted down to a small number. Further, since the operation speed measuring circuit is provided independently with the power supply terminal, the operation speed measuring circuit can be disposed in the area independently of the intra-chip integrated circuit design area.

As described above, the operation speed measuring circuit according to the present invention is so constructed as to be controllable if one input terminal and at least one output terminal are disposed and is therefore applicable to the case where the number of placeable terminals is restricted down to a small number.

Further, according to the semiconductor device of the present invention, since the semiconductor chip incorporates the operation speed measuring circuit of the present invention, there may suffice at least two signal terminals to be secured for the operation speed measuring circuit according to the present invention.

Further, the operation speed measuring circuit is provided with the power supply terminal independent of other circuits, and, therefore, the construction of the operation speed measuring circuit can be set independently of the constructions of other circuits.

Moreover, the operation speed measuring circuit is disposed in the area independent of other integrated circuit design area within the chip, and hence there is remarkably improved a degree of freedom of designing other circuits in the areas exclusive of the relevant independent area. The relevant independent area is set in one of the corner areas of the chip that have hitherto been nothing but the empty areas on the semiconductor chip. Accordingly, there is no necessity for securing the area for laying out the operation speed measuring circuit in the integrated circuit design area, and the degree of freedom of designing the circuit is remarkably improved. Eliminated also is an influence on the degree of integration due to providing the operation speed measuring circuit.

It is apparent that, in this invention, a wide range of different working modes can be formed based on the invention without deviating from the spirit and scope of the invention. This invention is not restricted by its specific working modes except being limited by the appended claims.

What is claimed is:

1. An operation speed measuring circuit comprising:
    one input terminal;
    a first path, connected to said input terminal and including a plurality of logic gates of same kind connected in series, for generating a predetermined propagation delay time in an inputted signal;
    a second path, connected to said input terminal and including an integer number of logic gates of same kind as said first path connected in series, for generating a propagation delay time smaller than the predetermined propagation delay time in the inputted signal;
    a frequency divider for dividing a frequency of the signal inputted from said input terminal;
    a selection gate circuit for selecting one of a first signal propagated via said first path and a second signal propagated via said second path in accordance with an output signal from said frequency divider, said first path and said second path comprising buffers; and
    at least one output terminal for outputting the signal selected by said selection gate circuit;
    said selection gate circuit including:
        a first gate comprising an AND gate for controlling propagation of an input, to said first path, of the signal inputted from said input terminal in accordance with the output signal from said frequency divider;
        a second gate comprising an OR gate for controlling propagation of an input, to said second path, of the signal inputted from said input terminal in accordance with the output signal from said frequency divider; and a third gate for outputting a result of a logic operation of the first and second signals.

2. A semiconductor device having integrated circuits and an operation speed measuring circuit thereon, said operation speed measuring circuit comprising:

one input terminal;

a first path, connected to said input terminal and including a plurality of logic gates of same kind connected in series, for generating a predetermined propagation delay time in an inputted signal, said first path comprising a buffer;

a second path, connected to said input terminal and including an integer number of logic gates of same kind as said first path connected in series, for generating a propagation delay time smaller than the predetermined propagation delay time in the inputted signal, said second path comprising a buffer;

a frequency divider for dividing a frequency of the signal inputted from said input terminal;

a selection gate circuit for selecting one of a first signal propagated via said first path and a second signal propagated via said second path in accordance with an output signal from said frequency divider; and at least one output terminal for outputting the signal selected by said selection gate circuit;

said selection gate circuit including:

a first gate comprising an AND gate for controlling propagation of an input, to said first path, of the signal inputted from said input terminal in accordance with the output signal from said frequency divider;

a second gate comprising an OR gate for controlling propagation of an input, to said second path, of the signal inputted from said input terminal in accordance with the output signal from said frequency divider; and a third gate for outputting a result of a logic operation of the first and second signals.

3. The semiconductor device according to claim 2, wherein said operation speed measuring circuit includes:

a power supply terminal connected only to said operation speed measuring circuit within said semiconductor device.

4. The semiconductor device according to claim 2, wherein an area for laying out said operation speed measuring circuit is separated from an integrated circuit design area within said semiconductor device.

5. The semiconductor device according to claim 4, wherein the area for laying out said operation speed measuring circuit is a corner area on said semiconductor device.

* * * * *